United States Patent [19]

Van Kessel

[11] 4,409,556
[45] Oct. 11, 1983

[54] AMPLIFIER ARRANGEMENT WITH VERY LOW DISTORTION

[75] Inventor: Theodorus J. Van Kessel, Eindhoven, Netherlands

[73] Assignee: U.S. Philips Corporation, New York, N.Y.

[21] Appl. No.: 270,771

[22] Filed: Jun. 5, 1981

[30] Foreign Application Priority Data

Jul. 7, 1980 [NL] Netherlands ........................ 8003905

[51] Int. Cl.³ .......................... H03F 1/34; H03F 1/26; H03F 3/45
[52] U.S. Cl. ...................................... 330/75; 330/85; 330/149; 330/260
[58] Field of Search ..................... 330/86, 75, 85, 149, 330/105, 260

[56] References Cited

U.S. PATENT DOCUMENTS 4,222,012 9/1980 Yokoyama ............................. 330/85

Primary Examiner—James B. Mullins
Assistant Examiner—Gene Wan
Attorney, Agent, or Firm—Robert T. Mayer; Bernard Franzblau

[57] ABSTRACT

A low distortion amplifier arrangement includes an amplifier having an inverting input, a non-inverting input, and an output, a first impedance coupled between the output and the inverting input, and a second impedance coupled between an input terminal of the amplifier arrangement and the amplifier inverting input. An impedance network is coupled between the inverting and the non-inverting inputs of the amplifier. The impedance value of said impedance network substantially corresponds to the impedance value of the parallel connection of the first impedance and the second impedance, but with opposite sign. The gain of the amplifier arrangement is independent of the gain of the amplifier and corresponds to the ratio of the impedance values of said first and second impedances to produce an amplifier arrangement with a very low distortion.

9 Claims, 1 Drawing Figure

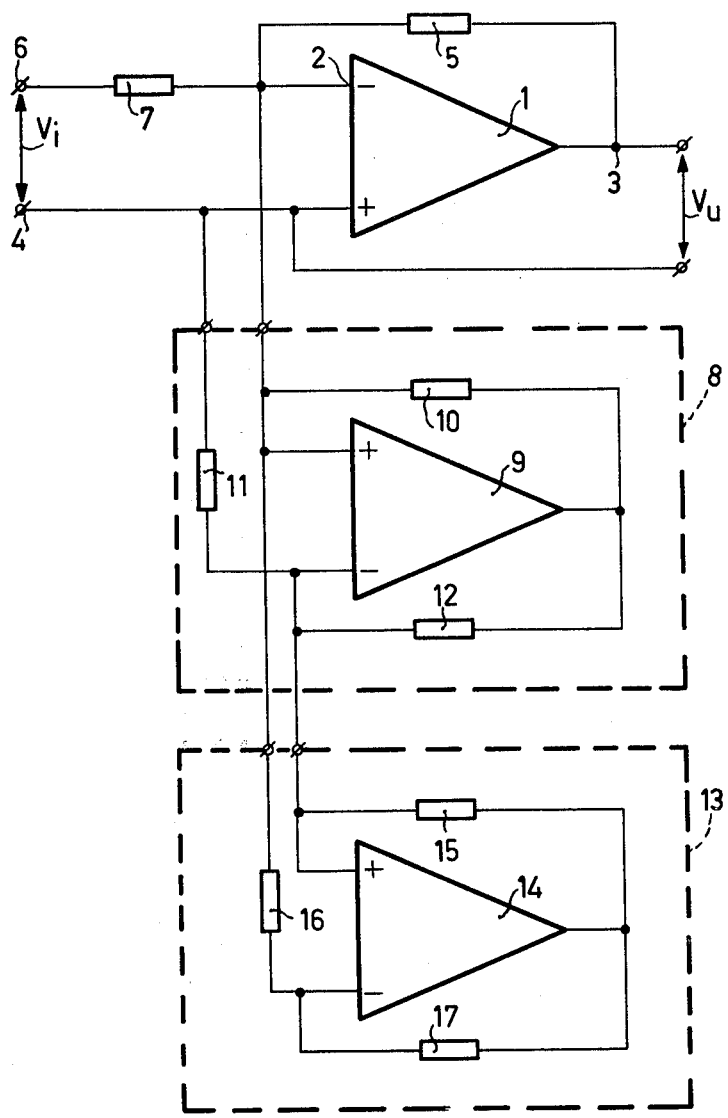

AMPLIFIER ARRANGEMENT WITH VERY LOW DISTORTION

The invention relates to an amplifier arrangement, comprising an amplifier with an inverting input, a non-inverting input and an output, a first impedance included between the output and the inverting input and a second impedance included between an input terminal of the amplifier arrangement and the inverting input of the amplifier.

For calculations on such a generally known amplifier arrangement, which is for example described in Elektronica, part 2, "Analoge techniek" by C. Rijsberman, published by Kluwer, page 94, it is assumed that the gain of the amplifier arrangement is infinite. The gain of the amplifier arrangement then becomes equal to the ratio of the impedance values of the first and the second impedance. In practice, the gain of the amplifier is hardly ever infinite, certainly not as a function of the frequency, so that also the gain of the amplifier arrangement will never be exactly equal to the ratio of the impedance values of the first and the second impedance. This non-ideal behaviour of the amplifier arrangement therefore also prevents an optimum reduction of the amplifier distortion by means of feedback.

It is an object of the invention to provide an amplifier arrangement which, for a non-infinite gain of the amplifier, still ensures that the amplifier arrangememt has a gain equal to the ratio of said first and second impedances and which moreover enables an amplifier arrangement with a very low distortion.

To this end, the amplifier arrangement in accordance with the invention is characterized in that the amplifier arrangement comprises an impedance network having a first and a second terminal, which network is coupled between the inverting input and the non-inverting input of the amplifier, the value of the impedance of said impedance network at least substantially corresponding to the impedance value of a parallel connection of the first and the second impedance, but of opposite sign.

The invention is based on the recognition that by including an impedance network between the inverting and the non-inverting input of the amplifier and by selecting the impedance value of this impedance network to be at least substantially equal to the impedance value of a parallel connection of the first and the second impedances but with opposite sign, the gain of the amplifier arrangement can be made equal to the ratio of the impedance values of the first and the second impedance regardless of the actual value of the amplifier gain.

It is to be noted that in fact the impedance value of the impedance network would have to be equal to the negative impedance value of the parallel connection of the first and the second impedance and an impedance which corresponds to the internal impedance of the amplifier. However, as in general this last-mentioned impedance is comparatively high, it suffices that the impedance value should at least substantially correspond to that of the parallel connection of the first and the second impedances.

Such an amplifier arrangement in accordance with the invention can simply be realized in that the impedance network comprises a further amplifier having an inverting input, a non-inverting input and an output, that the first terminal of the impedance network is connected to the non-inverting input of the further amplifier and via a third impedance to the output of the further amplifier, that the second terminal of the impedance network is connected to the inverting input of the further amplifier via a fourth impedance, and that furthermore a fifth impedance is included between the output and the inverting input of the further amplifier.

If the impedance value of the third impedance is selected to be at least substantially equal to that of the fifth impedance and the impedance value of the fourth impedance is made to correspond at least substantially to the impedance value of the parallel connection of the first and the second impedance, said negative impedance is obtained.

The fourth impedance may be constituted by a parallel connection of two impedances which correspond to the first and the second impedance. This step ensures that the distortion in the amplifier arrangement is minimized and in principle only depends on the distortion contributed by the further amplifier. The impedance network now compensates for the amount of distortion contributed by the original amplifier in an optimum manner.

As the further amplifier is designed so that it needs to supply a substantially lower power than the amplifier of the amplifier arrangement, the distortion of the further amplifier is correspondingly smaller so that an amplifier arrangement with a low distortion is obtained.

A preferred embodiment of the amplifier arrangement in accordance with the invention is characterized in that the impedance value of the fourth impedance is at least substantially equal to that of the fifth impedance and that the impedance value of the third impedance at least substantially corresponds to the impedance value of the parallel connection of the first and the second impedance. This choice of the impedance values of the various impedances allows for the non-ideal behaviour of the further amplifier and defines a setting of the further amplifier for which an optimum cancellation of the distortion of the amplifier is obtained. It is even possible to obtain a very simple circuit arrangement for the impedance network if the impedance values of the third, the fourth and the fifth impedance are selected to be equal to each other.

A further embodiment of the amplifier arrangement in accordance with the invention is characterized in that the amplifier arrangement comprises a further impedance network having a first and a second terminal, which network is included between the inverting input and the non-inverting input of the further amplifier, the value of the impedance of the further impedance network at least substantially corresponding to the impedance of a parallel connection of the fourth and fifth impedance, but of opposite sign.

By applying the principle of the invention to the further amplifier of the impedance network, it is possible to compensate for the distortion contributed by said further amplifier.

In this respect it is to be noted again that the impedance value of the further impedance network should in fact be equal to the negative impedance value of the parallel connection of the fourth impedance, the fifth impedance and an impedance which corresponds to the internal impedance of the further amplifier. As in general said last-mentioned impedance is comparatively high, it is acceptable that the impedance value of the further impedance network should at least substantially correspond to that of the parallel connection of the fourth and the fifth impedance.

The further impedance network may be designed in a manner similar to that described for the impedance network in the foregoing.

The invention will now be described by way of example with reference to the drawing, the sole FIGURE of which shows an embodiment of the amplifier arrangement in accordance with the invention.

In the FIGURE an amplifier 1 comprises a feedback path in the form of a first impedance 5 included between its inverting imput 2 and its output 3. Between an input terminal 6 of the amplifier arrangement and the inverting input 2 of the amplifier 1 there is included a second impedance 7. The input terminal 4 of the amplifier arrangement is connected directly to the non-inverting input of the amplifier 1.

When it is assumed that the gain of the amplifier 1 is infinite, the gain of the amplifier arrangement constituted by the amplifier 1 and the impedances 5 and 7 will be equal to the ratio of the impedances 5 and 7. However, in practice the gain of the amplifier 1 is never infinite so that the gain of the amplifier arrangement will never be exactly equal to the ratio of the impedances 5 and 7. As a result the distortion of the amplifier 1 can no longer be reduced in an optimum manner by means of its feedback.

Now an impedance network is included between the inverting and the non-inverting input of the amplifier 1.

Assuming that the gain A of amplifier 1 is not infinite and the input impedance of the amplifier 1 is infinite, the gain of the amplifier arrangement will be $$\frac{V_u}{V_i} = \frac{-Z_2 A}{Z_1(1 + A) + Z_2 + Z_1 Z_2/z}$$

where $Z_1$, $Z_2$ and $Z$ respectively represent the impedance values of the first impedance, the second impedance and the impedance value of the impedance network 8. Assuming that Z is equal to the negative impedance value of the parallel connection of the first and the second impedance $-Z_1Z_2/(Z_1+Z_2)$, the gain of the amplifier arrangement will be $$\frac{V_u}{V_i} = \frac{-Z_2}{Z_1}$$

which gain is independent of the gain of the amplifier 1.

A similar calcultation, which allows for the non-infinite input impedance of amplifier 1, would yield the requirement that Z should be equal to the parallel connection of the first impedance, the second impedance and an impedance corresponding to the internal impedance of the amplifier 1. However, as in general the last-mentioned impedance is substantially higher than the two other impedance values, the previously mentioned requirement suffices.

The impedance network 8 may comprise a further amplifier 9 having a non-inverting input connected to the inverting input 2 of amplifier 1 and via a third impedance 10 to its output. The inverting input of the further amplifier 9 is connected to the non-inverting input 4 of amplifier 1 via a fourth impedance 11. Furthermore, there is included a fifth impedance 12 between the inverting input and the output of the further amplifier 9.

In order to realize an impedance which is approximately equal to $-Z_1Z_2/(Z_1+Z_2)$ with the impedance network 8, the third impedance 10 and the fifth impedance 12 may be assumed to be equal and the impedance value of the fourth impedance 11 is selected to be at least substantially equal the impedance value of the parallel connection of the first and the second impedances 5 and 7, $Z_1Z_2/(Z_1+Z_2)$. This circuit enables the distortion components resulting from the amplifier 1 to be largely compensated for. The distortion components in the output signal $V_u$ are now mainly determined by the distortion contributed by the further amplifier 9. As said amplifier 9 is dimensioned so that it supplies a substantially lower power than the amplifier 1, the corresponding contribution to the distortion by the amplifier 9 is also substantially smaller, so that a substantial reduction in the distortion is obtained as a result of the inclusion of the impendace network 8.

Another possibility of realizing an impedance equal to $-Z_1Z_2/(Z_1+Z_2)$ by means of the impedance network 8 is to make the fourth impedance 11 and the fifth impedance 12 equal to each other and to select the impedance value of the third impedance 10 to equal $Z_1Z_2/(Z_1+Z_2)$. This choice of the impedance values allows for the non-ideal behaviour of the further amplifier 9 and represents the optimum setting of said further amplifier at which an optimum cancellation of the distortion of the amplifier 1 is obtained. The simplest circuit arrangement is then that in which the three impedances 10, 11 and 12 are equal to each other and equal to $Z_1Z_2/(Z_1+Z_2)$.

The distortion of the amplifier arrangement, which is now mainly caused by the residual distortion components of the further amplifier 9, may further be reduced by including a further impedance network 13 between the inverting and the non-inverting input of the further amplifier 9, the impedance value of the further impedance network 13 at least substantially corresponding to the value of the parallel connection of the fourth and the fifth impedances 11 and 12, but with an opposite sign, $-Z_4Z_5/(Z_4+Z_5)$. What has been stated for the impedance network 8 in the foregoing also applies to the impedance value of the further impedance network 13.

The further impedance network 13 comprises another amplifier 14 having a non-inverting input connected to the inverting input of the further amplifier 9 and, via a sixth impedance 15, to its output. The inverting input of the other amplifier 14 is connected to the non-inverting input of the further amplifier 9 via a seventh impedance 16.

Furthermore, an eighth impedance 17 is included between the inverting input and the output of the other amplifier 14.

In order to realize an impedance which is at least approximately equal to $-Z_4Z_5/(Z_4+Z_5)$ by means of the further impedance network 13, the sixth impedance 15 and the eighth impedance 17 can be made equal to each other and the impedance value of the seventh impedance can be selected to equal the impedance value of the parallel connection of the fourth and the fifth impedance 11 and 12. By means of this circuit arrangement the residual distortion components caused by the further amplifier 9 can be largely eliminated. The distortion components in the output signal $V_u$ are now mainly determined by the distortion contributed by the other amplifier 14.

As said other amplifier 14 is biassed so that it supplies a substantially lower power than the further amplifier 9, the distortion of said other amplifier 14 and thus the distortion in the output signal $V_u$ is corresondingly smaller, so that an additional reduction in the distortion of the output singal $V_u$ can be obtained owing to the inclusion of the further impedance network 13.

A further possibility of realizing an impedance equal to $-Z_4Z_5/(Z_4+Z_5)$ with the further impedance network 13 is to make the seventh impedance 16 and the eighth impedance 17 equal to each other and to select the impedance value of the sixth impedance 5 to be equal to $Z_4Z_5/(Z_4+Z_5)$. This choice for the impedance values allows for the non-ideal behaviour of the other amplifier 14 and represents the optimum setting of said other amplifier 14 for which an optimum reduction of the distortion of the amplifier arrangement by means of the further amplifier 9 is obtained.

The simplest circuit arrangement for the further impedance network 13 is that in which the three impedances 15, 16 and 17 are equal to each other and equal to $Z_4Z_5/(Z_4+Z_5)$.

Finally, it is to be noted that the invention is not limited to the embodiment as shown in the FIGURE, but equally applies to embodiments which differ from the described embodiment with respect to features not relating to the inventive principle.

What is claimed is:

1. An amplifier arrangement comprisng: an amplifier having an inverting input, a non-inverting input and an output, a first impedance coupled between the output and the inverting input of the amplifier and a second impedance coupled between an input terminal of the amplifier arrangement and the inverting input of the amplifier, an impedance network having a first and a second terminal, means coupling said network between the inverting input and the non-inverting input of the amplifier, the value of the impedance of said impedance network substantially corresponding to the impedance value of a parallel connection of the first impedance and the second impedance, but of opposite sign.

2. An amplifier arrangement as claimed in claim 1, wherein the impedance network comprises a further amplifier having an inverting input, a non-inverting input and an output, means connecting the first terminal of the impedance network to the non-inverting input of the further amplifier and, via a third impedance to the output of the further amplifier, means connecting the second terminal of the impedance network to the inverting input of the further amplifier via a fourth impedance, and a fifth impedance coupled between the output and the inverting input of the further amplifier.

3. An amplfier arrangement as claimed in claim 2, wherein the impedance value of the third impedance is substantially equal to that of the fifth impedance and that the impedance value of the fourth impedance substantially corresponds to the impedance value of a parallel connection of the first impedance and the second impedance.

4. An amplifier arrangement as claimed in claim 2, wherein the impedance value of the fourth impedance is substantially equal to that of the fifth impedance and the impedance value of the third impedance substantially corresponds to the impedance value of a parallel connection of the first impedance and the second impedance.

5. An amplifier arrangement as claimed in claims 2, 3 or 4 wherein the amplifier arrangement comprises a further impedance network having a first terminal and a second terminal, means coupling said further network between the inverting input and the non-inverting input of the further amplifier, the value of the impedance of the further impedance network substantially corresponding to the impedance value of a parallel connection of the fourth impedance and the fifth impedance, but of opposite sign.

6. An amplifier arrangement as claimed in claim 5, wherein said further impedance network comprises an other amplifier having an inverting input, a non-inverting input and an output, means connecting the first terminal of the further impedance network to the non-inverting input of the other amplifier and, via a sixth impedance, to the output of the other amplifier, means connecting the second terminal of the further impedance network to the inverting input of the other amplifier via a seventh impedance, and an eighth impedance coupled between the output and the inverting input of the other amplifier.

7. An amplifier arrangement as claimed in claim 6, wherein the impedance value of the sixth impedance substantially corresponds to that of the eighth impedance and the impedance value of the seventh impedance substantially corresponds to the impedance value of a parallel connection of the fourth impedance and the fifth impedance.

8. An amplifier arrangement as claimed in claim 6, wherein the impedance value of the seventh impedance substantially corresponds to that of the eighth impedance and the impedance value of the sixth impedance substantially corresponds to the impedance value of a parallel connection of the fourth impedance and the fifth impedance.

9. An amplifier arrangement as claimed in claim 2 wherein the impedance values of the third, fourth and fifth impedances ae equal to each other and are equal to the impedance value of a parallel connection of the first and second impedances.

* * * * *

UNITED STATES PATENT AND TRADEMARK OFFICE
CERTIFICATE OF CORRECTION

PATENT NO. : 4,409,556
DATED : October 11, 1983
INVENTOR(S) : THEODORUS J. VAN KESSEL It is certified that error appears in the above-identified patent and that said Letters Patent is hereby corrected as shown below:

Column 1, line 31, delete "enables" and insert

--produces--

Signed and Sealed this

Sixteenth Day of July 1985

[SEAL]

Attest:

DONALD J. QUIGG

Attesting Officer     Acting Commissioner of Patents and Trademarks